(12) United States Patent
Kim et al.

(10) Patent No.: US 11,889,724 B2
(45) Date of Patent: Jan. 30, 2024

(54) DISPLAY DEVICE INCLUDING A SEALING AREA OVERLAPPING TRANSFER WIRINGS

(71) Applicant: SAMSUNG DISPLAY CO., LTD., Yongin-si (KR)

(72) Inventors: Hwiseong Kim, Seongnam-si (KR); Donghoo Kim, Cheonan-si (KR); Hoisoo Kwon, Cheonan-si (KR); Hee-Won Yoon, Asan-si (KR); Soojeong Choi, Paju-si (KR); Gwangjoon Hong, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 153 days.

(21) Appl. No.: 16/884,341

(22) Filed: May 27, 2020

(65) Prior Publication Data
US 2021/0111238 A1      Apr. 15, 2021

(30) Foreign Application Priority Data

Oct. 14, 2019      (KR) .................. 10-2019-0127254

(51) Int. Cl.
*H10K 59/131* (2023.01)
*H10K 50/84* (2023.01)
*H10K 102/00* (2023.01)

(52) U.S. Cl.
CPC ......... *H10K 59/131* (2023.02); *H10K 50/841* (2023.02); *H10K 2102/00* (2023.02)

(58) Field of Classification Search
CPC ............... H01L 27/3276; H01L 51/524; H01L 2251/303; H01L 51/5237; H01L 51/56;
(Continued)

(56) References Cited

U.S. PATENT DOCUMENTS

2007/0164675 A1\* 7/2007 Amano ............... H01L 27/1214
                                                              313/512
2011/0272714 A1\* 11/2011 Lhee .................... H01L 27/3276
                                                              257/E51.018
(Continued)

FOREIGN PATENT DOCUMENTS

| KR | 10-0639005 | 10/2006 |
|---|---|---|
| KR | 10-1035627 | 5/2011 |
| WO | WO-2020202349 A1 \* | 10/2020 |

*Primary Examiner* — Nduka E Ojeh
*Assistant Examiner* — Laura M Dykes
(74) *Attorney, Agent, or Firm* — F. Chau & Associates, LLC

(57) ABSTRACT

A display device includes: an array substrate including a pixel array disposed on a display area, a first transfer wiring disposed on a peripheral area adjacent to the display area and electrically connected to the pixel array, a second transfer wiring disposed on the peripheral area adjacent to the display area and electrically connected to the pixel array, and a barrier member disposed between the first transfer wiring and the second transfer wiring, the barrier member including an inorganic insulation material; and a sealing member disposed between the array substrate and an encapsulation substrate to combine the array substrate with the encapsulation substrate, the sealing member contacting at least a portion of the first transfer wiring and the second transfer wiring.

9 Claims, 17 Drawing Sheets

(58) Field of Classification Search
CPC .............. H10K 59/131; H10K 50/841; H10K 2102/00; H10K 59/87; H10K 50/84; H10K 71/00
USPC .......................................................... 257/40
See application file for complete search history.

(56) References Cited

U.S. PATENT DOCUMENTS

| | | | |
|---|---|---|---|
| 2015/0001500 A1* | 1/2015 | Sung ................. | H01L 51/52 |
| | | | 257/40 |
| 2016/0343974 A1* | 11/2016 | Jang ................... | H01L 51/5246 |
| 2017/0287995 A1* | 10/2017 | Kim .................... | H01L 27/3276 |
| 2020/0343327 A1* | 10/2020 | Liu ..................... | H10K 71/00 |

* cited by examiner

DISPLAY DEVICE INCLUDING A SEALING AREA OVERLAPPING TRANSFER WIRINGS

CROSS-REFERENCE TO RELATED APPLICATION

This application claims priority under 35 U.S.C. § 119 to Korean Patent Application No. 10-2019-0127254 filed on Oct. 14, 2019 in the Korean Intellectual Property Office, the disclosure of which is incorporated by reference herein in its entirety.

TECHNICAL FIELD

Exemplary embodiments of the present invention relate to a display device including a sealing area overlapping transfer wirings.

DISCUSSION OF THE RELATED ART

A display device includes an array substrate including an array of pixels. The array substrate may be combined with an opposing substrate or an encapsulation substrate to protect the array of pixels.

In order to combine the array substrate with the encapsulation substrate, a sealing material such as glass frit may be disposed between the encapsulation substrate and the array substrate and may be heated by a laser. However, the sealing area may contain metal wirings. When a metal wiring in a sealing area is heated by the laser, a metallic component of the metal wiring may melt thus reducing a space from an adjacent metal wiring. When a distance between adjacent metal wirings is decreased, a defect such as a short circuit may be caused.

SUMMARY

According to an exemplary embodiment of the present invention, a display device includes: an array substrate including a pixel array disposed on a display area, a first transfer wiring disposed on a peripheral area adjacent to the display area and electrically connected to the pixel array, a second transfer wiring disposed on the peripheral area adjacent to the display area and electrically connected to the pixel array, and a barrier member disposed between the first transfer wiring and the second transfer wiring, the barrier member including an inorganic insulation material; and a sealing member disposed between the array substrate and an encapsulation substrate to combine the array substrate with the encapsulation substrate, the sealing member contacting at least a portion of the first transfer wiring and the second transfer wiring.

The barrier member may have a multi-layered structure.

A height of the barrier member may be larger than a height of at least one of the first transfer wiring and a height of the second transfer wiring.

The first transfer wiring and the second transfer wiring may be spaced apart from the barrier member.

The array substrate may include at least one insulation layer disposed on the peripheral area, and the insulation layer may be partially removed in the peripheral area to form a first recess and a second recess, and the barrier member may be disposed between the first recess and the second recess.

A portion of the first transfer wiring may be disposed in the first recess, and a portion of the second transfer wiring may be disposed in the second recess.

A capping pattern may cover at least a portion of the first transfer wiring.

The capping pattern may include a material having a melting point higher than a melting point of the first transfer wiring.

The capping pattern may include silver, and the first transfer wiring may include aluminum.

The pixel array may include an organic light-emitting element, and the first transfer wiring and the second transfer wiring may provide a power voltage to the organic light-emitting element.

According to an exemplary embodiment of the present invention, a display device includes: an array substrate including a pixel array disposed on a display area, a first transfer wiring disposed on a peripheral area adjacent to the display area and electrically connected to the pixel array, a second transfer wiring disposed on the peripheral area adjacent to the display area and electrically connected to the pixel array, and a capping pattern at least partially covering at least one of the first transfer wiring and the second transfer wiring; and a sealing member disposed between the array substrate and an encapsulation substrate to combine the array substrate with the encapsulation substrate, the sealing member contacting at least a portion of the first transfer wiring and the second transfer wiring.

The capping pattern may include a material having a melting point higher than a melting point of at least one of the first transfer wiring and the second transfer wiring.

The capping pattern may include silver, and the first transfer wiring and the second transfer wiring may include aluminum.

The capping pattern may include: a first capping pattern covering at least a portion of the first transfer wiring; and a second capping pattern covering at least a portion of the second transfer wiring.

The pixel array may include a first electrode, a second electrode and an organic light-emitting layer disposed between the first and second electrodes, wherein the capping pattern may be formed from a same layer as the first electrode.

According to an exemplary embodiment of the present invention, a display device includes: an array substrate including a pixel array disposed on a display area, a first transfer wiring disposed on a peripheral area adjacent to the display area and electrically connected to the pixel array, and a second transfer wiring disposed on the peripheral area adjacent to the display area and electrically connected to the pixel array; an encapsulation substrate disposed on the array substrate, the encapsulation substrate including a transmittance-adjusting pattern overlapping at least a portion of the first transfer wiring and the second transfer wiring; and a sealing member disposed between the array substrate and the encapsulation substrate to combine the array substrate with the encapsulation substrate, the sealing member contacting at least a portion of the first transfer wiring and the second transfer wiring and overlapping the transmittance-adjusting pattern.

The transmittance-adjusting pattern may include a metal oxide.

The transmittance-adjusting pattern may include: a metal oxide layer; and metal patterns disposed on the metal oxide layer and spaced apart from each other.

The transmittance-adjusting pattern may include: metal oxide patterns; and metal patterns having a shape at least partially surrounding the metal oxide patterns, respectively.

An area of the encapsulation substrate, including the transmittance-adjusting pattern may have a laser transmittance lower than a laser transmittance of an area of the encapsulation substrate where the transmittance-adjusting pattern is not disposed by at least 5%.

BRIEF DESCRIPTION OF THE DRAWINGS invention. The above and other features of the present invention will be more clearly understood by describing in detail exemplary embodiments thereof taken in conjunction with the accompanying drawings, in which.

DETAILED DESCRIPTION OF THE EMBODIMENTS

A display device according to exemplary embodiments of the present invention will be described hereinafter with reference to the accompanying drawings, in which some exemplary embodiments are shown.

Figure 1:
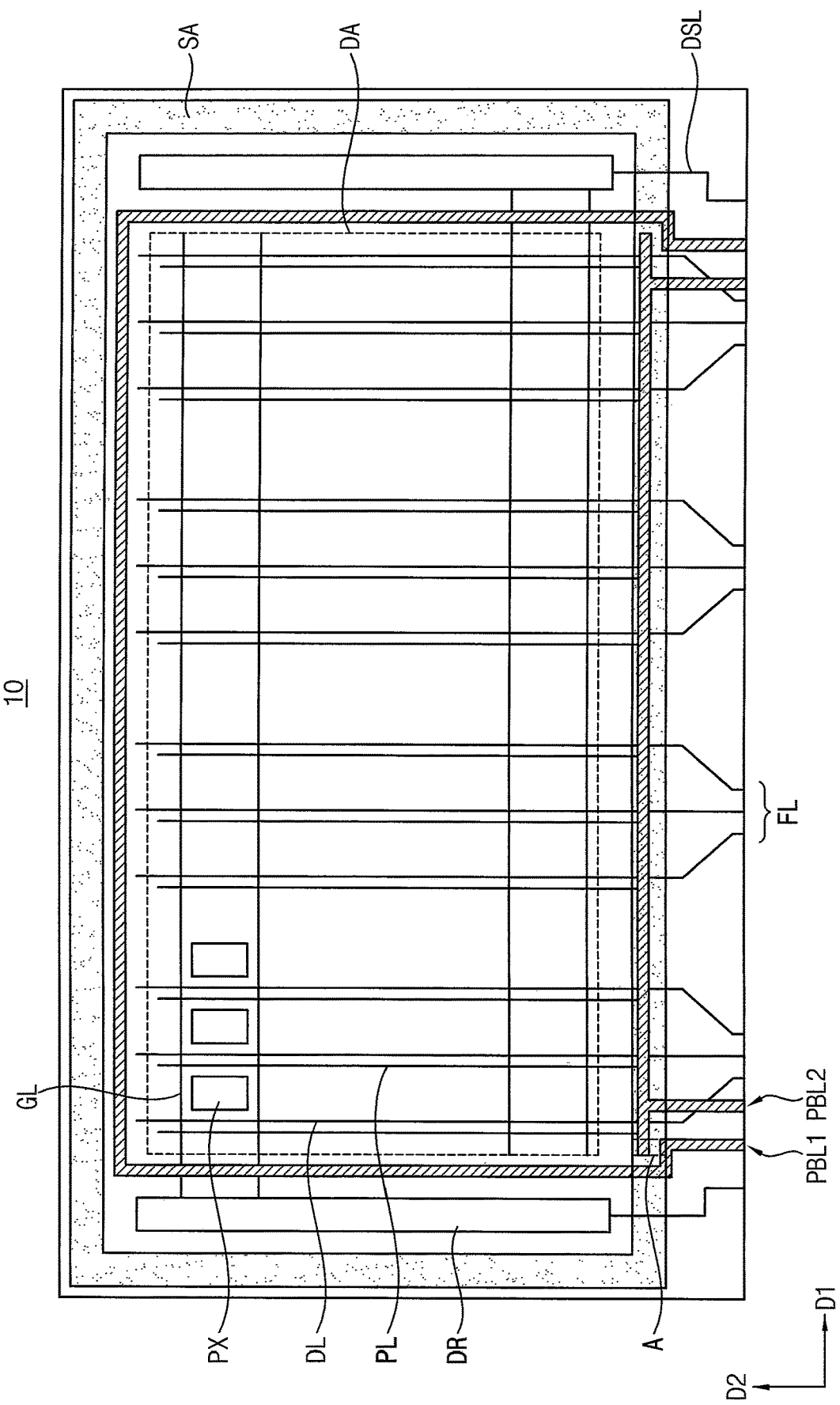
FIG. 1 is a plan view illustrating a display device according to an exemplary embodiment of the present invention.
Figure 2:
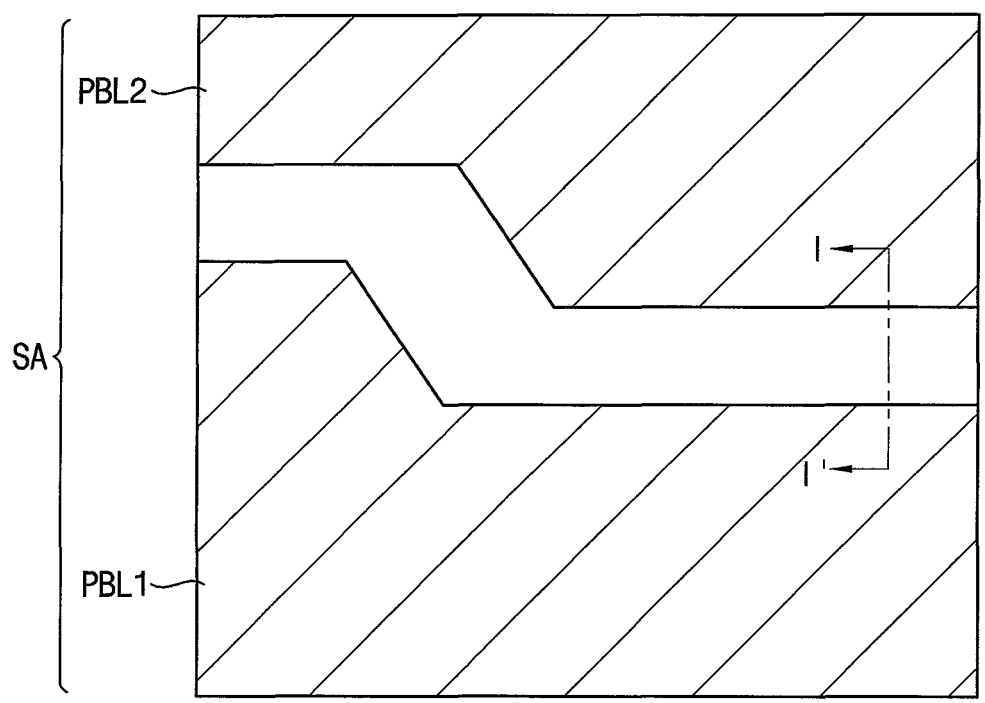
FIG. 2 is an enlarged plan view of region A of FIG. 1 illustrating a sealing area of a display device according to an exemplary embodiment of the present invention.

FIG. 1 is a plan view illustrating a display device according to an exemplary embodiment of the present invention. FIG. 2 is an enlarged plan view of region A of FIG. 1 illustrating a sealing area of a display device according to an exemplary embodiment. Referring to FIG. 1, a display device 10 according to an exemplary embodiment of the present invention includes a display area DA and a peripheral area at least partially surrounding the display area DA. The display area DA may generate a light or may adjust transmittance of a light provided by an external light source to display an image. The peripheral area may be defined by an area of the display device 10 not displaying an image.

In an exemplary embodiment of the present invention, the display device 10 may be an organic light-emitting display panel. For example, an array of pixels PX including a light-emitting element may be disposed in the display area DA to generate a light in response to a driving signal. A signal wiring and a power wiring may be disposed in the display area DA to transfer a driving signal and a power voltage to the pixels PX. For example, a gate line GL, a data line DL and a power line PL may be disposed in the display area DA. The gate line GL may extend along a first direction (e.g., the D1 direction) and may provide a gate signal to the pixels PX. The data line DL may extend along a second direction (e.g., the D2 direction) crossing the first direction (e.g., the D1 direction) and may provide a data signal to the pixels PX. The power line PL may extend along the second direction (e.g., the D2 direction) and may provide a power voltage to the pixels PX.

A transfer wiring, a circuit part or the like may be disposed in the peripheral area. The transfer wiring may transfer a driving signal or a power voltage to the display area DA. The circuit part may generate a driving signal. For example, a driver DR generating a gate signal, a control signal wiring DSL transferring a control signal to the driver DR, a fan-out wiring FL transferring a data signal to the data line DL, a first transfer wiring PBL1 transferring a first power voltage to the pixels PX and a second transfer wiring PBL2 transferring a second power voltage to the power line PL or the like may be disposed in the peripheral area.

In an exemplary embodiment of the present invention, the first transfer wiring PBL1 may transfer the first power voltage to a cathode of an organic light-emitting diode. A constant voltage may be applied to the first transfer wiring PBL1 and the second transfer wiring PBL2. However, the present invention is not limited thereto. The first transfer wiring PBL1 and the second transfer wiring PBL2 may also be referred to herein more generally as a first transfer wiring PBL1 and a second transfer wiring PBL2, respectively.

The transfer wiring may be electrically connected to an external driving device such as a printed circuit board, a driving chip or the like to receive a driving signal, a control signal, a power or the like. The first transfer wiring PBL1 may surround first and second parallel short sides and a first long side of the display area DA, and the second transfer wiring PBL2 may surround a second long side of the display area DA parallel to the first long side.

In an exemplary embodiment of the present invention, the peripheral area includes a sealing area SA where a sealing member is disposed. The sealing area SA may have a shape surrounding the display area DA. The sealing member SA may be disposed between an outer edge of the peripheral area and the display area DA.

The first transfer wiring PBL1 and the second transfer wiring PBL2 may extend along the first direction (e.g., the D1 direction) and the second direction (e.g., the D2 direction) crossing the first direction (e.g., the D1 direction), in the peripheral area.

In an exemplary embodiment of the present invention, at least a portion of the transfer wirings may overlap the sealing member SA. In an exemplary embodiment of the present invention, in the sealing area SA, at least a portion of the first transfer wiring PBL1 and at least a portion of the second transfer wiring PBL2 may extend along the first direction (e.g., the D1 direction) and may be spaced apart from each other along the second direction (e.g., the D2 direction). For example, the first transfer wiring PBL1 may have first and second vertical portions extending in the second direction (e.g., the D2 direction), the ends of which are displaced from one another in the first direction (e.g., the D1 direction), and joined by a horizontal portion therebetween that extends in the first direction (e.g., the D1 direction). The second transfer wiring PBL2 may include a horizontal portion extending in the first direction (e.g., the D1 direction) and vertical portions extending in the second direction (e.g., the D2 direction) from opposite end regions of the horizontal portion of the second transfer wiring PBL2.

An end of the horizontal portion of the first transfer wiring PBL1 may overlap an end of the horizontal portion of the second transfer wiring PBL2.

Figure 3:
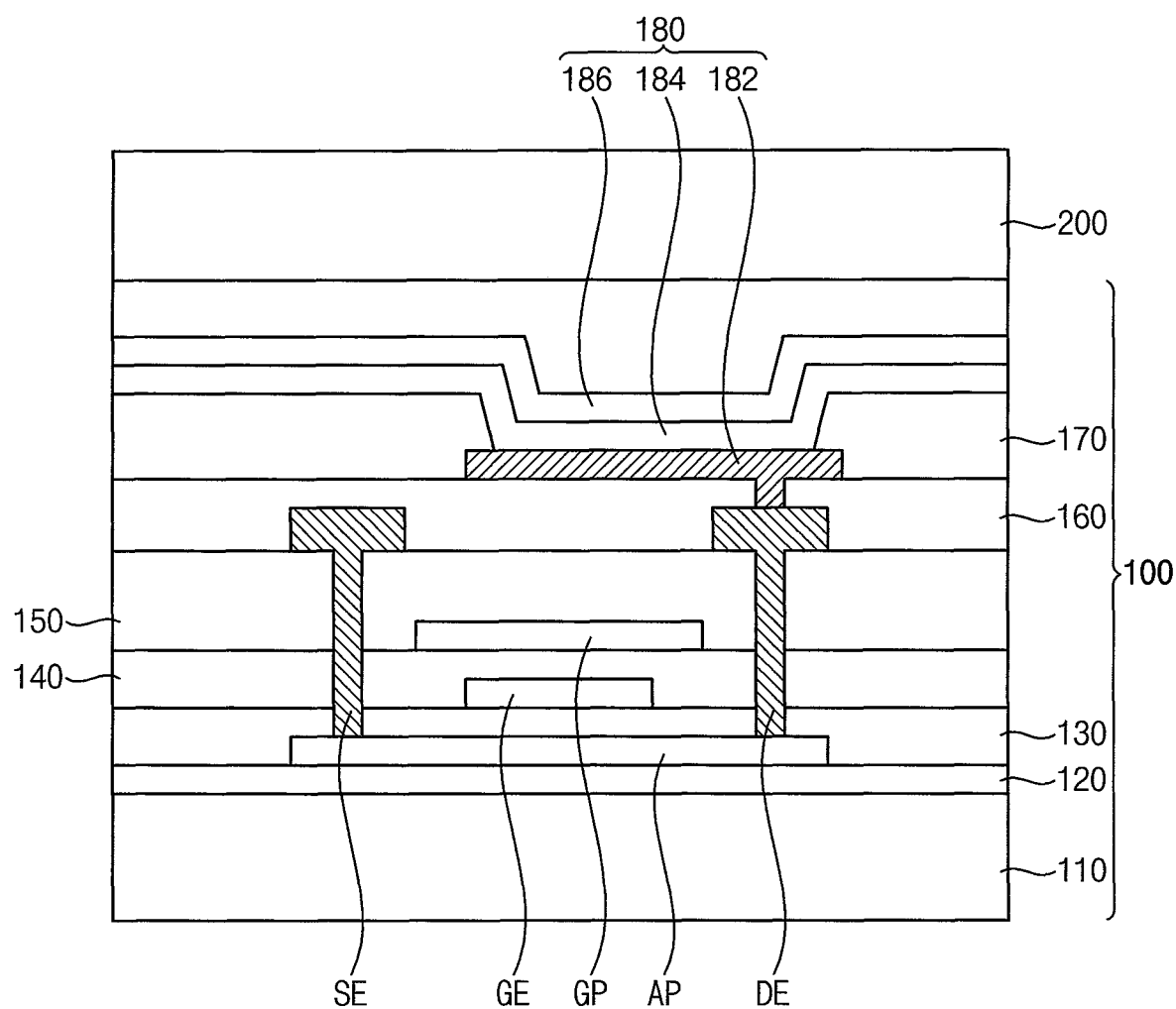
FIG. 3 is a cross-sectional view illustrating a cross-section of a display area of a display device according to an exemplary embodiment of the present invention.
Figure 4:
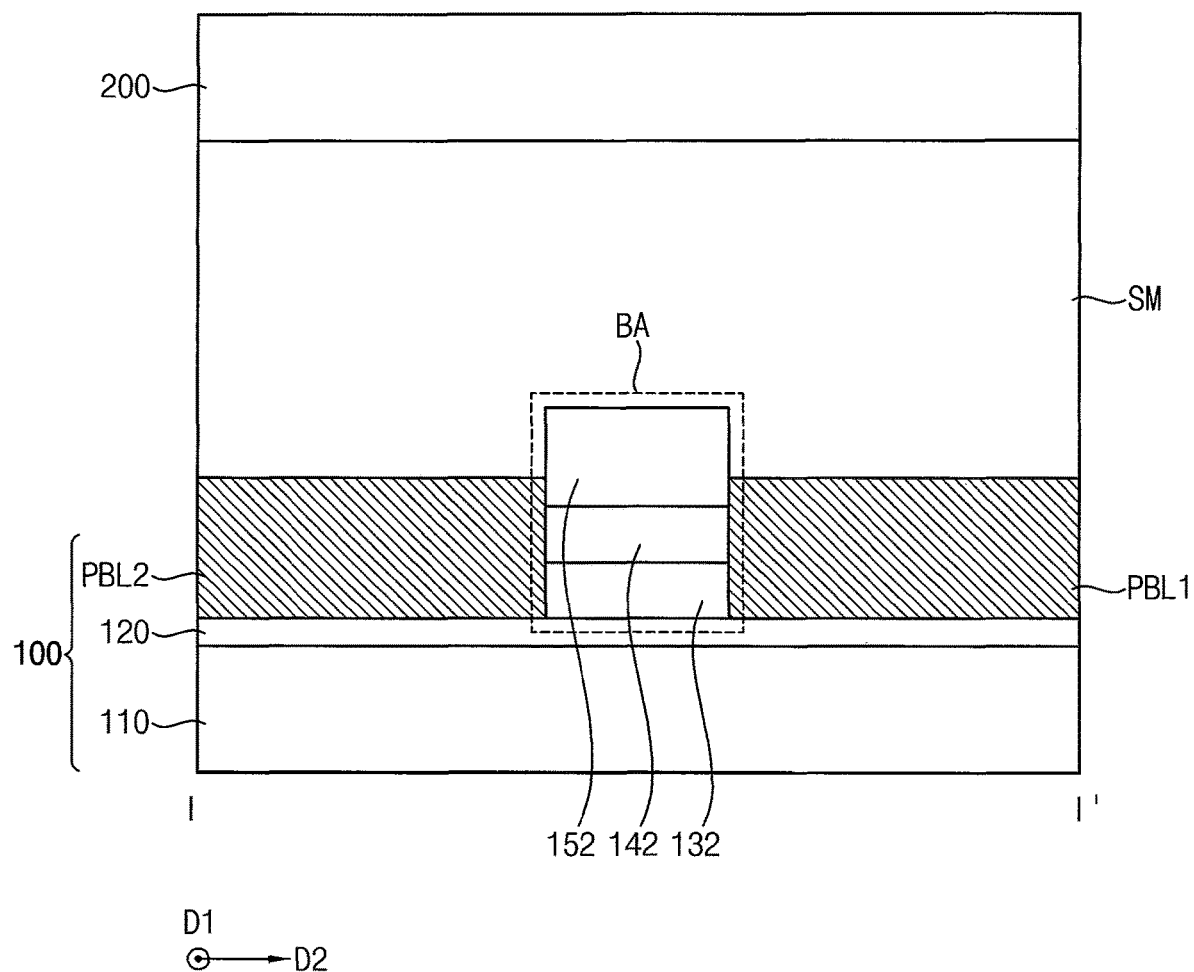
FIG. 4 is a cross-sectional view illustrating a cross-section of a sealing area of a display device according to an exemplary embodiment of the present invention, taken along the line I-I' of FIG. 2.

FIG. 3 is a cross-sectional view illustrating a cross-section of a display area of a display device according to an exemplary embodiment of the present invention. FIG. 4 is a cross-sectional view taken along line I-I' of FIG. 2 illustrating a peripheral area of a display device according to an exemplary embodiment of the present invention.

Referring to FIG. 3, a display device includes an array substrate 100 and an encapsulation substrate 200. An array of pixels is disposed in a display area DA of the array substrate 100. A pixel unit disposed in the display area DA may include a driving element disposed on a base substrate 110 and a light-emitting element electrically connected to the driving element. In an exemplary embodiment of the present invention, the light-emitting element may be an organic light-emitting diode.

A buffer layer 120 may be disposed on the base substrate 110. An active pattern AP may be disposed on the buffer layer 120.

For example, the base substrate 110 may include glass, quartz, sapphire, a polymeric material or the like. In an exemplary embodiment of the present invention, the base substrate 110 may include a transparent rigid material such as glass.

The buffer layer 120 may prevent or reduce permeation of impurities, humidity or external gas from underneath of the base substrate 110, and may provide a planar upper surface of the base substrate 110. For example, the buffer layer 120 may include an inorganic material such as oxide, nitride or the like.

A first gate metal pattern including a gate electrode GE may be disposed on the active pattern AP. A first insulation layer 130 may be disposed between the active pattern AP and the gate electrode GE. The first insulation layer 130 may also overlap side surfaces and at least a portion of an upper surface of the active pattern 130.

A second gate metal pattern including a gate wiring pattern GP may be disposed on the gate electrode GE. The gate wiring pattern GP may include a capacitor electrode for forming a capacitor, a wiring for transferring various signals or the like.

A second insulation layer 140 may be disposed between the gate electrode GE and the gate wiring pattern GP. The second insulation layer 140 may also overlap side surfaces of the gate wiring pattern GP. A third insulation layer 150 may be disposed on the gate wiring pattern GP. The third insulation layer 150 may also overlap side surfaces of the gate wiring pattern GP.

For example, the active pattern AP may include silicon or a metal oxide semiconductor. In an exemplary embodiment of the present invention, the active pattern AP may include polycrystalline silicon (polysilicon), which may be doped with n-type impurities or p-type impurities.

In an exemplary embodiment of the present invention, an active pattern may include a metal oxide semiconductor. For example, the active pattern may include a two-component compound (ABx), a ternary compound (ABxCy) or a four-component compound (ABxCyDz), which contains indium (In), zinc (Zn), gallium (Ga), tin (Sn), titanium (Ti), aluminum (Al), hafnium (Hf), zirconium (Zr) and/or magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

The first insulation layer 130, the second insulation layer 140 and the third insulation layer 150 may include silicon oxide, silicon nitride, silicon carbide or a combination thereof. Furthermore, the first insulation layer 130, the second insulation layer 140 and the third insulation layer 150 may include an insulating metal oxide such as aluminum oxide, tantalum oxide, hafnium oxide, zirconium oxide, titanium oxide or the like. For example, the first insulation layer 130, the second insulation layer 140 and the third insulation layer 150 may have a single-layered structure or a multi-layered structure including silicon nitride and/or silicon oxide, respectively, or may have different structures and materials from each other.

The gate electrode GE and the gate wiring pattern GP may include a metal, a metal alloy, a metal nitride, a conductive metal oxide or the like. For example, the gate electrode GE and the gate wiring pattern GP may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 150. The first source metal pattern may include a source electrode SE and a drain electrode DE, which electrically contact the active pattern AP. The source electrode SE and the drain electrode DE may pass through the first through third insulation layers 130, 140 and 150 disposed thereunder to contact the active pattern AP, respectively.

The first source metal pattern may include a metal, a metal alloy, a metal nitride, a conductive metal oxide or the like. For example, the first source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an exemplary embodiment of the present invention, the first source metal pattern may have a multi-layered structure including an aluminum layer.

A fourth insulation layer 160 may be disposed on the first source metal pattern. The fourth insulation layer 160 may include an organic material. For example, the fourth insulation layer 160 may include an organic insulation material such as a phenol resin, an acryl resin, a polyimide resin, a polyamide resin, a siloxane resin, an epoxy resin or the like.

An organic light-emitting diode 180 may be disposed on the fourth insulation layer 160. The organic light-emitting diode 180 may include a first electrode 182 electrically connected to the drain electrode DE, an organic light-emitting layer 184 disposed on the first electrode 182 and a second electrode 186 disposed on the organic light-emitting layer 184. The organic light-emitting layer 184 of the organic light-emitting diode 180 may be disposed at least in an opening of a pixel-defining layer 170 disposed on the fourth insulation layer 160. The first electrode 182 may be a lower electrode of the organic light-emitting diode 180, and the second electrode 186 may be an upper electrode of the organic light-emitting diode 180.

The first electrode 182 may function as an anode. For example, the first electrode 182 may be formed as a transmitting electrode or a reflecting electrode according to an emission type of the display device (a front emission type or a rear emission type). When the first electrode 182 is a transmitting electrode, the first electrode 182 may include indium tin oxide, indium zinc oxide, zinc tin oxide, indium oxide, zinc oxide, tin oxide or the like. When the first electrode 182 is a reflecting electrode, the first electrode 182 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

The pixel-defining layer 170 has an opening overlapping at least a portion of the first electrode 182. For example, the pixel-defining layer 170 may include an organic insulating material.

The organic light-emitting layer 184 may include at least a light-emitting layer, and may further include at least one of a hole injection layer (HIL), a hole transporting layer (HTL), an electron transporting layer (ETL) and an electron injection layer (EIL). For example, the organic light-emitting layer 184 may include a low molecular weight organic compound or a high molecular weight organic compound.

In an exemplary embodiment of the present invention, the organic light-emitting layer 184 may emit a red light, a green light or a blue light. In an exemplary embodiment of the present invention, the organic light-emitting layer 184 may emit a white light. The organic light-emitting layer 184 emitting a white light may have a multi-layer structure including a red-emitting layer, a green-emitting layer and a blue-emitting layer, or a single-layer structure including a mixture of a red-emitting material, a green-emitting material and a blue-emitting material.

The second electrode 186 may be formed as a transmitting electrode or a reflecting electrode according to an emission type of the display device. For example, the second electrode 186 may include a metal, a metal alloy, a metal nitride, a metal fluoride, a conductive metal oxide or a combination thereof.

For example, the second electrode 186 may be formed as a common layer extending continuously over a plurality of pixels in the display area DA.

An encapsulation substrate 200 is disposed on the organic light-emitting diode 180. For example, the encapsulation substrate 200 may include glass, quartz, sapphire, a polymeric material or the like. In an exemplary embodiment of the present invention, the encapsulation substrate 200 may include a transparent rigid material such as glass.

For example, a spacer may be disposed under the encapsulation substrate 200 to support the encapsulation substrate 200. The spacer may be disposed between the encapsulation substrate 200 and the organic light-emitting diode 180 or between the pixel-defining layer 170 and the second electrode 186 of the organic light-emitting diode 180.

According to an exemplary embodiment of the present invention, a space between the encapsulation substrate 200 and the organic light-emitting diode 180 may have a vacuum state or may be filled with a gas or a sealing member. The sealing member may include an organic layer, an inorganic layer or a combination thereof.

Referring to FIG. 4, a first transfer wiring PBL1 and a second transfer wiring PBL2 are disposed in a peripheral area. At least one of the first transfer wiring PBL1 and the second transfer wiring PBL2 may overlap a sealing member SM. For example, at least a portion of the first transfer wiring PBL1 and the second transfer wiring PBL2 may contact the sealing member SM. The sealing member SM may be disposed between the first and second transfer wirings PBL1 and PBL2 and the encapsulation substrate 200.

In an area where the sealing member SM is disposed, the first transfer wiring PBL1 and the second transfer wiring PBL2 may respectively extend along a first direction (e.g., the D1 direction), and may be spaced apart from each other along a second direction (e.g., the D2 direction) crossing the first direction (e.g., the D1 direction).

The first transfer wiring PBL1 and the second transfer wiring PBL2 may be formed from a same layer as the first source metal pattern disposed in the display area DA that includes the source electrode SE and the drain electrode DE. Thus, the first transfer wiring PBL1 and the second transfer wiring PBL2 may be included in the first source metal pattern. However, exemplary embodiments of the present invention are not limited thereto. For example, when the array substrate 100 includes a second source metal pattern including a connection electrode electrically connecting the drain electrode of the driving element to the first electrode of the organic light-emitting diode, at least one of the first transfer wiring PBL1 and the second transfer wiring PBL2 may be included in the second source metal pattern.

A barrier member BA is disposed between the first transfer wiring PBL1 and the second transfer wiring PBL2. The barrier member BA may have a single-layered structure or a multi-layered structure. For example, the barrier member BA may include a first barrier layer 132, a second barrier layer 142 and a third barrier layer 152. For example, the first barrier layer 132 may be formed from a same layer as the first insulation layer 130 disposed in the display area DA. The second barrier layer 142 may be formed from a same layer as the second insulation layer 140 disposed in the display area DA. The third barrier layer 152 may be formed from a same layer as the third insulation layer 150 disposed in the display area DA. In an exemplary embodiment of the present invention, the barrier member BA may have a single-layered structure formed from a same layer as the third insulation layer 150 disposed in the display area DA.

In an exemplary embodiment of the present invention, the barrier member BA may have a shape extending along the first direction (e.g., the D1 direction). However, exemplary embodiments of the present invention are not limited thereto. In another area, the first transfer wiring PBL1 and the second transfer wiring PBL2 may extend along the second direction (e.g., the D2 direction), and may be spaced apart from each other along the first direction (e.g., the D1 direction).

In an exemplary embodiment of the present invention, the barrier member BA may substantially exclude an organic insulation material.

Referring to FIG. 4, the first transfer wiring PBL1 and the second transfer wiring PBL2 are disposed on a buffer layer 120. However, exemplary embodiments of the present invention are not limited thereto. A structure under the first transfer wiring PBL1 and the second transfer wiring PBL2 may be changed depending on an etching process or the like. For example, the first transfer wiring PBL1 and the second transfer wiring PBL2 may be disposed on a first insulation layer 130 or a second insulation layer 140, which extends from the display area DA.

In an exemplary embodiment of the present invention, a height of the barrier member BA may be greater than a height of at least one of the first transfer wiring PBL1 and a height of the second transfer wiring PBL2. For example, the third insulation layer 150, which may form the barrier member BA, may be an interlayer insulation layer, which has a thickness larger than a thickness of the first source metal pattern forming the first and second transfer wirings PBL1 and PBL2.

In an exemplary embodiment of the present invention, the barrier member BA is disposed between the first transfer wiring PBL1 and the second transfer wiring PBL2. Thus, even if the first transfer wiring PBL1 or the second transfer wiring PBL2 is heated in the process of forming the sealing member SM, a short circuit due to melting of a metallic component may be prevented. Thus, reliability of a display device may be increased.

Furthermore, since defects may be prevented or reduced by the barrier member BA, a margin area for preventing defects may be reduced. Thus, a distance between the first transfer wiring PBL1 and the second transfer wiring PBL2 may be reduced, and a bezel of a display device 10 may be reduced.

Furthermore, the barrier member BA may be formed in the process of forming insulation layers of a display area DA. Thus, reliability of a display device 10 may be increased without performing an additional process.

FIGS. 5A, 5B, 6A, 6B, 7A, 7B, 8A and 8B are cross-sectional views illustrating steps in a method for manufacturing a display device according to an exemplary embodiment of the present invention. Particularly, FIGS. 5A, 6A, 7A and 8A may illustrate a driving element and a light-emitting element disposed in a display area, and FIGS. 5B, 6B, 7B and 8B may illustrate a peripheral area.

Figure 5A:
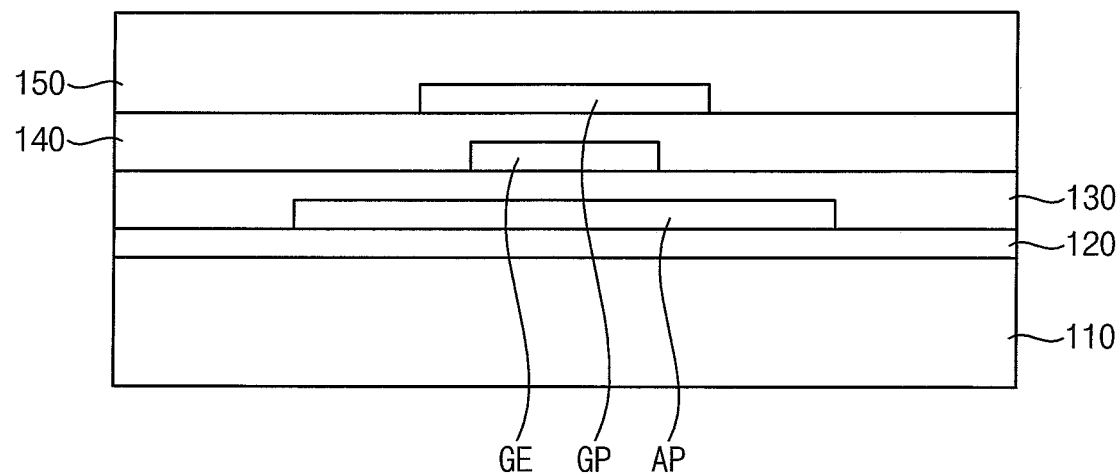
FIGS. 5A, 5B, 6A, 6B, 7A, 7B, 8A and 8B are cross-sectional views taken along line I-I' of FIG. 2 illustrating steps in a method for manufacturing a display device according to an exemplary embodiment of the present invention.

Referring to FIG. 5A, a buffer layer 120 is formed on a base substrate 110. An active pattern AP is formed on the buffer layer 120. A first insulation layer 130 is formed on the active pattern AP. A first gate metal pattern including a gate electrode GE is formed on the first insulation layer 130. A second insulation layer 140 is formed on the first gate metal pattern. A second gate metal pattern including a gate wiring pattern GP is formed on the second insulation layer 140. A third insulation layer 150 is formed on the second gate metal pattern.

Figure 5B:
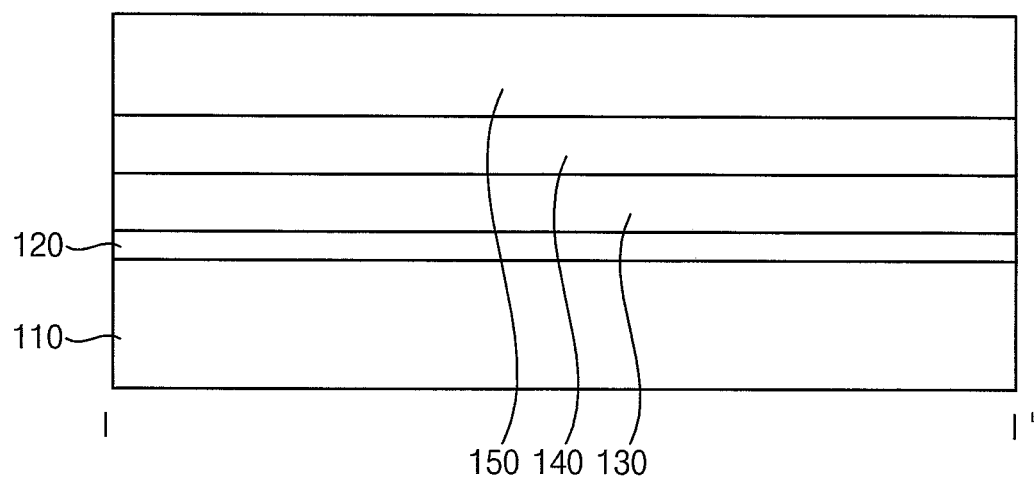

Referring to FIG. 5B, the buffer layer 120, the first insulation layer 130, the second insulation layer 140 and the third insulation layer 150 may extend to a peripheral area.

Figure 6A:
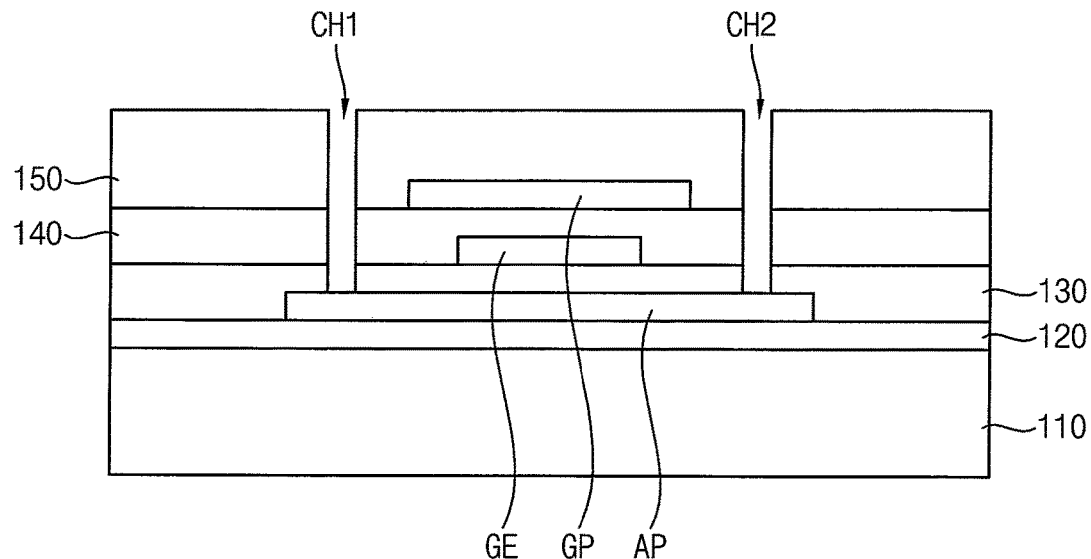

Referring to FIG. 6A, the insulation layers are patterned to form contact holes CH1 and CH2 exposing the active pattern AP. For example, the first insulation layer 130, the second insulation layer 140 and the third insulation layer 150 may be partially removed to form the contact holes CH1 and CH2.

Figure 6B:
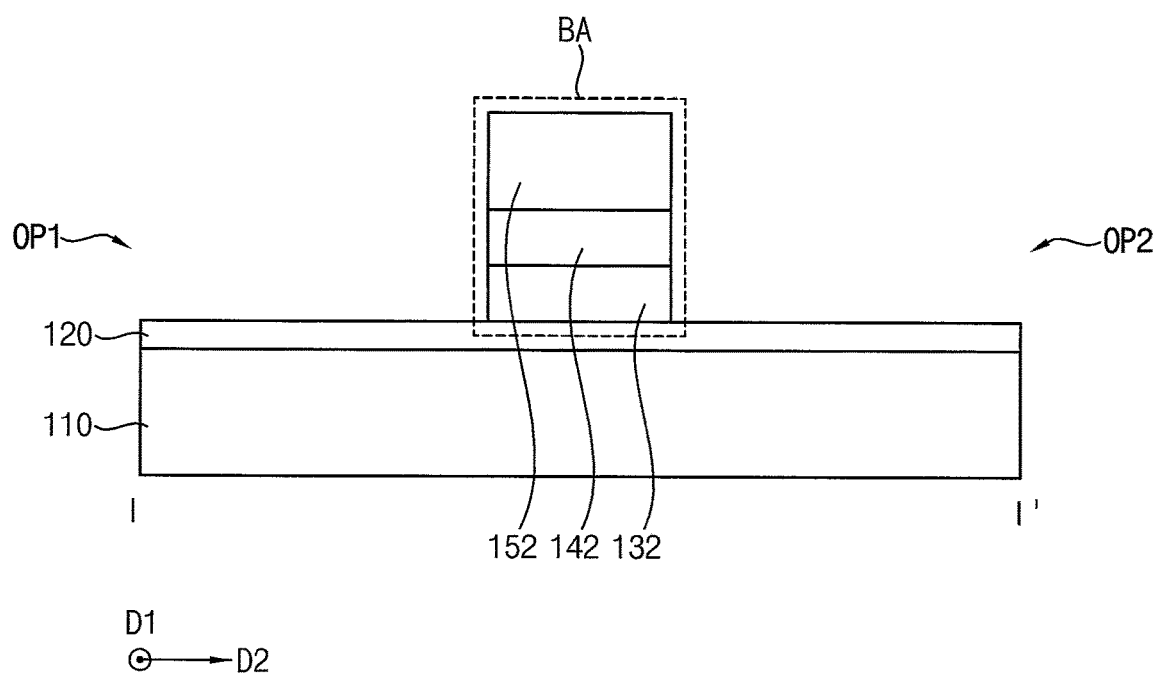

Referring to FIG. 6B, at least a portion of the insulation layers are removed in the peripheral area in the process of forming the contact holes CH1 and CH2, to form a recess and a barrier member BA. For example, the insulation layers are partially removed in the peripheral area to form a first recess OP1 and a second recess OP2, which are spaced apart from each other along a second direction (e.g., the D2 direction). A portion of the insulation layers, which remains between the first and second recesses OP1 and OP2, may define the barrier member BA.

For example, the barrier member BA may include a first barrier layer 132, a second barrier layer 142 and a third barrier layer 152 which may be the same or different heights in a thickness direction perpendicular to a plane defined by the first direction (e.g., the D1 direction) and the second direction (e.g., the D2 direction). The first barrier layer 132 is formed from a same layer as the first insulation layer 130 disposed in the display area DA. The second barrier layer 142 is formed from a same layer as the second insulation layer 140 disposed in the display area DA. The third barrier layer 152 is formed from a same layer as the third insulation layer 150 disposed in the display area. For example, the first barrier layer 132, the second barrier layer 142 and the third barrier layer 152 may include silicon oxide, silicon nitride, silicon carbide or a combination thereof. Furthermore, the first barrier layer 132, the second barrier layer 142 and the third barrier layer 152 may include an insulating metal oxide such as aluminum oxide, tantalum oxide, hafnium oxide, zirconium oxide, titanium oxide or the like. For example, the first barrier layer 132, the second barrier layer 142 and the third barrier layer 152 may have a single-layered structure or a multi-layered structure including silicon nitride and/or silicon oxide, respectively, or may have different structures and materials from each other.

However, the present invention is not limited thereto. For example, the barrier layer BA may include various other inorganic insulating materials and/or may be comprised of a single layer.

In an exemplary embodiment of the present invention, the contact holes CH1 and CH2 and the first and second recesses OP1 and OP2 may be formed in a same photolithography process. However, exemplary embodiments of the present invention are not limited thereto. For example, the contact holes CH1 and CH2 and the first and second recesses OP1 and OP2 may be formed in different photolithography processes to adjust a depth of the first and second recesses OP1 and OP2.

Figure 7A:
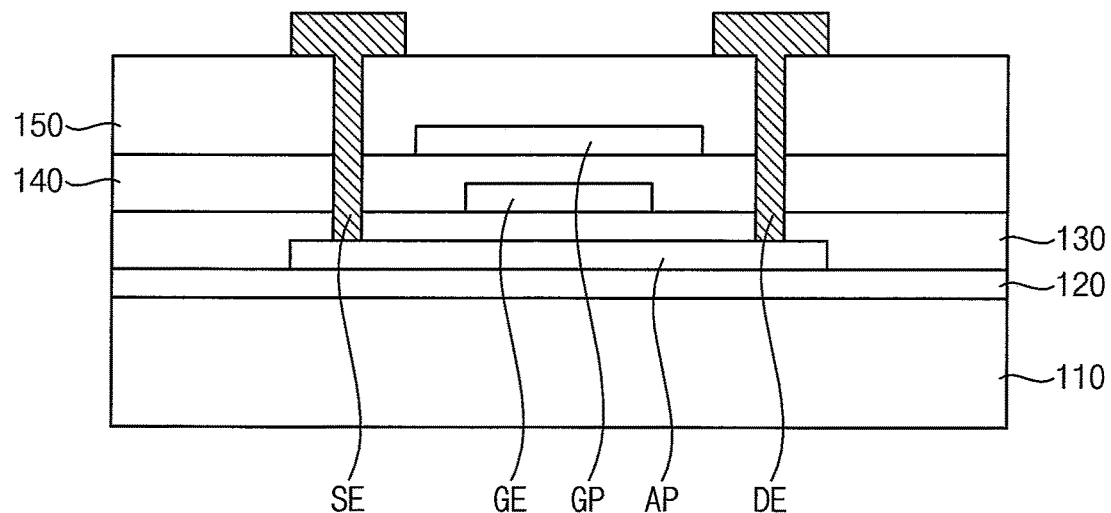
Figure 7B:
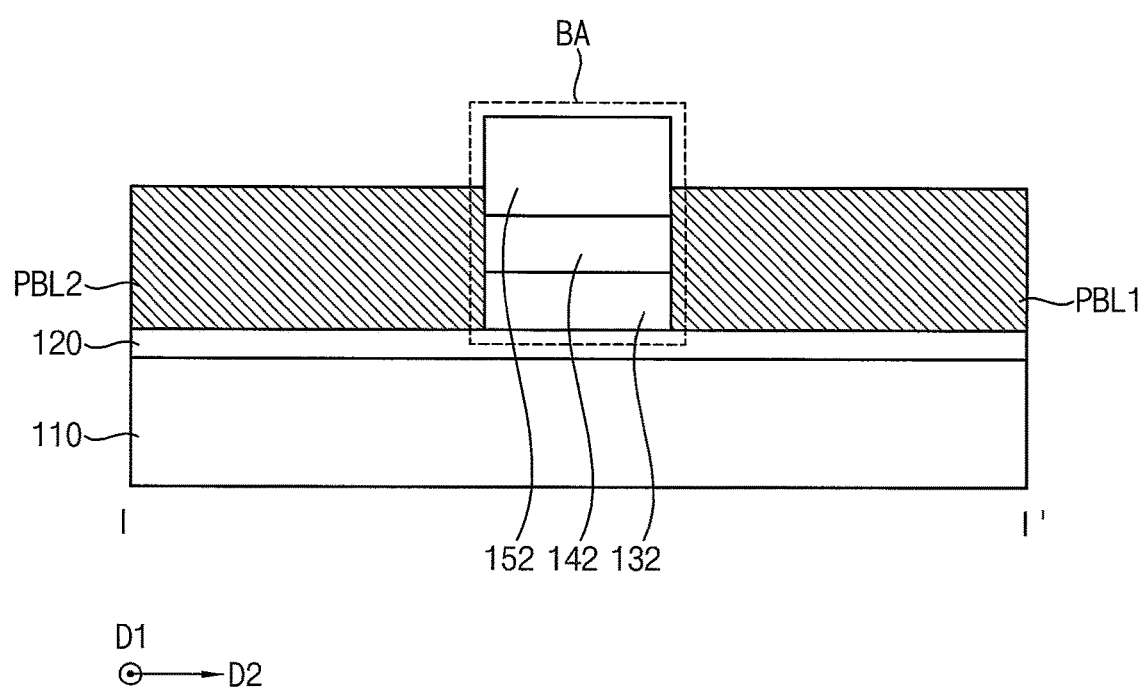

Referring to FIGS. 7A and 7B, a first source metal pattern is formed on the third insulation layer 150. The first source metal pattern includes a source electrode SE, a drain electrode DE and a transfer wiring. The transfer wiring may include the first transfer wiring PBL1 and/or the second transfer wiring PBL2. In an exemplary embodiment of the present invention, the source metal pattern may include an aluminum layer. For example, the first source metal pattern may have a multi-layered structure of titanium/aluminum/titanium.

At least a portion of the first transfer wiring PBL1 is disposed in the first recess OP1. At least a portion of the second transfer wiring PBL2 is disposed in the second recess OP2. Thus, the barrier member BA is disposed between the first transfer wiring PBL1 and the second transfer wiring PBL2.

Figure 8A:
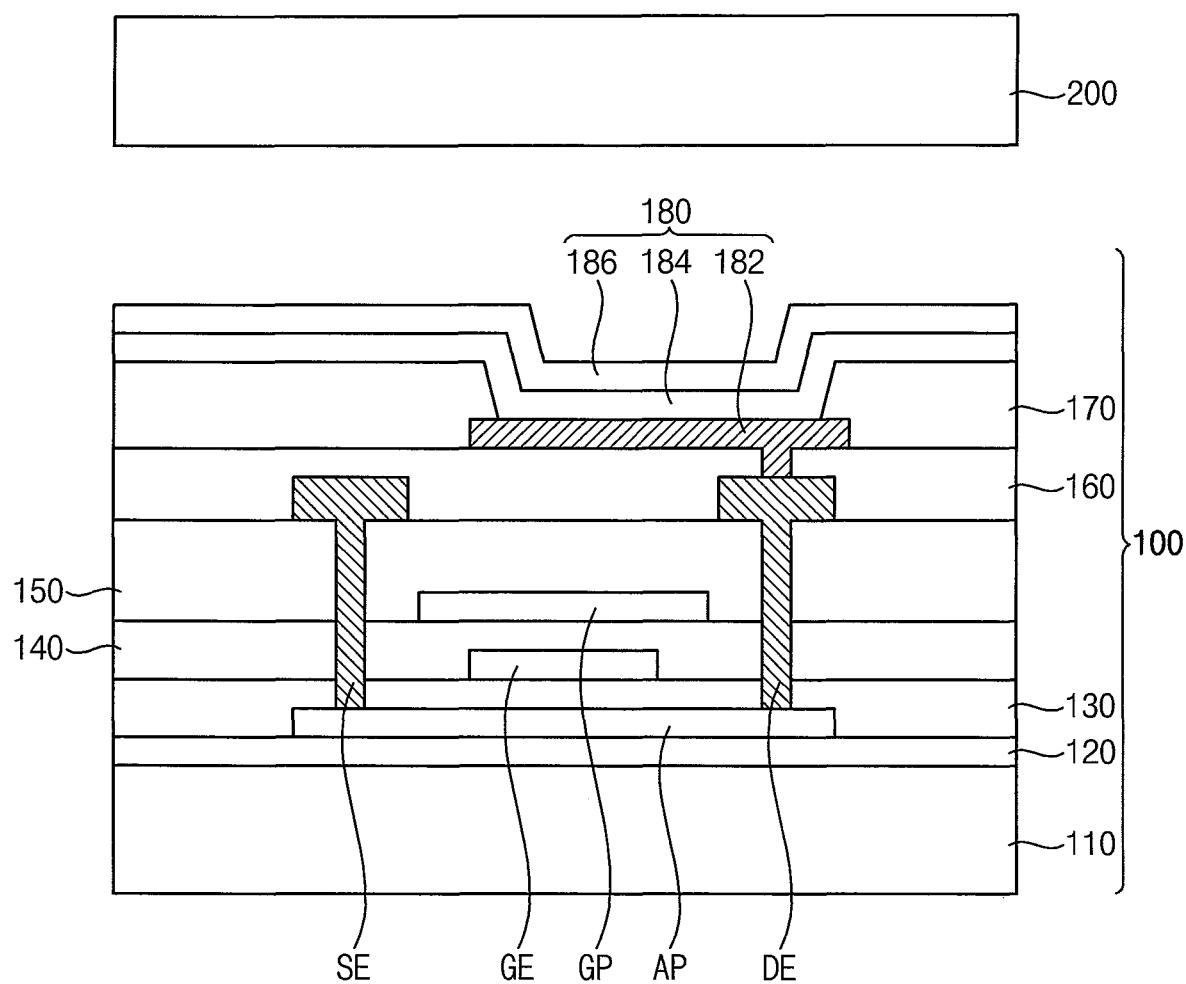

Referring to FIG. 8A, a fourth insulation layer 160 is formed in the display area DA to cover the first source metal pattern. A pixel-defining layer 170 and an organic light-emitting diode 180 are disposed on the fourth insulation layer 160.

Thereafter, an encapsulation substrate 200 is disposed on the array substrate 100 including the organic light-emitting diode 180. For example, the encapsulation substrate 200 may be disposed over the organic light-emitting diode 180 with a gap therebetween.

Figure 8B:
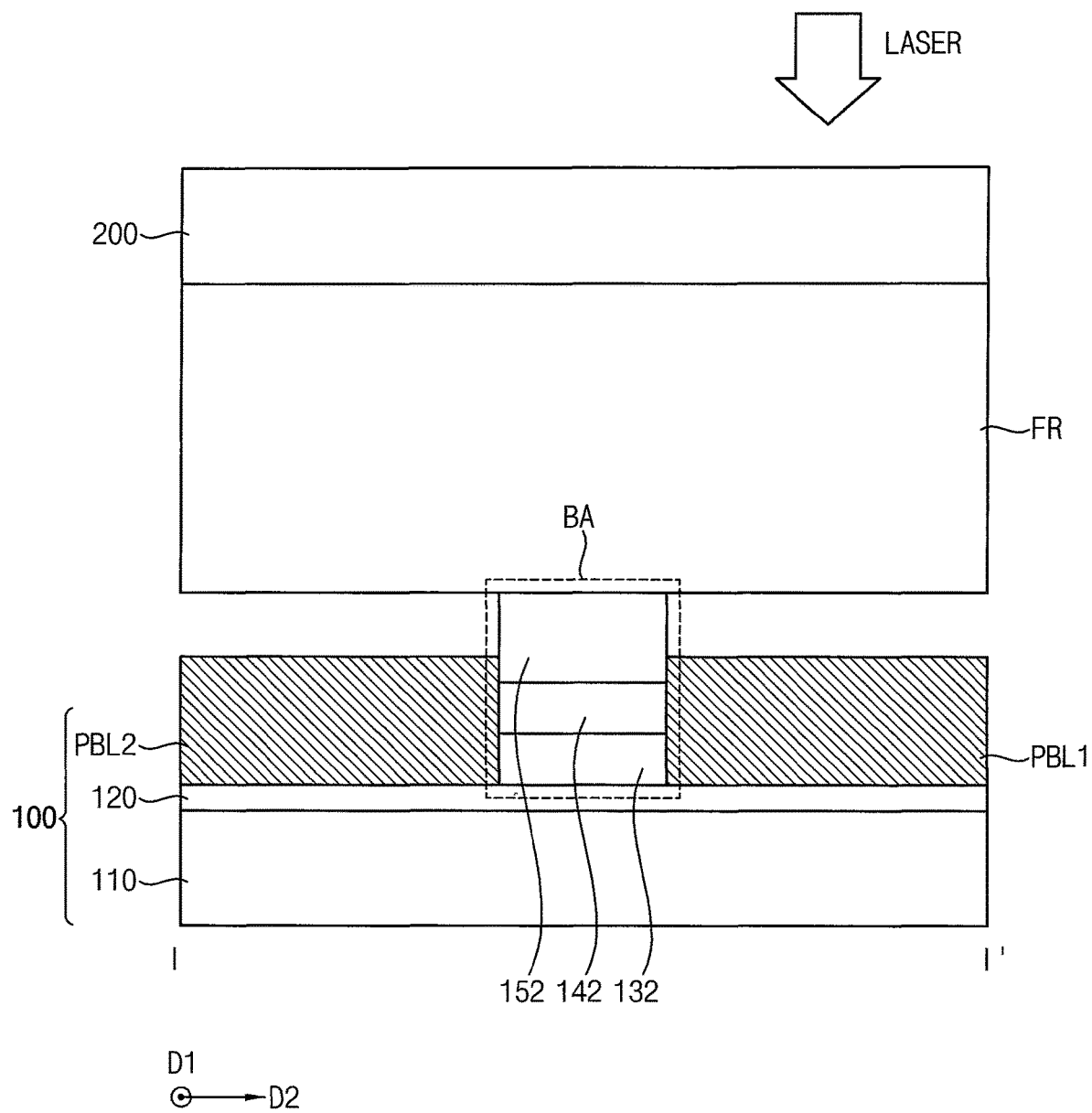

Referring to FIG. 8B, a sealing material FR is disposed between the array substrate 100 and the encapsulation substrate 200 in the sealing area SA.

For example, the sealing material FR is provided on a surface of the encapsulation substrate 200. However, exemplary embodiments of the present invention are not limited thereto. For example, the sealing material FR may be provided on a surface of the array substrate 100, and the encapsulation substrate 200 may be disposed on the sealing material FR. For example, a frit paste or the like may be coated in the sealing area SA of the array substrate 100 through a mask having an opening corresponding to the sealing area SA by a screen printing method to provide the sealing material FR on the array substrate 100. In an exemplary embodiment of the present invention, the fourth insulation layer 160 and the pixel-defining layer 170 may not be disposed in the sealing area SA.

The sealing material FR is heated by heat, UV ray, laser or the like to contact the array substrate 100. As a result, the array substrate 100 and the encapsulation substrate 200 are combined with each other, and the sealing material FR is sintered to form a sealing member SM.

For example, the sealing material FR may include a glass frit. For example, the glass fit may include an oxide power, a binder and a solvent. For example, the oxide powder may include lead oxide (PbO), silicon oxide ($SiO_2$), zinc oxide (ZnO), bismuth oxide ($Bi_2O_3$), boron oxide ($B_2O_3$, $B_2O_8$), iron oxide ($Fe_2O_3$), aluminum oxide ($Al_2O_3$) or a combination thereof.

In an exemplary embodiment of the present invention, the barrier member BA is disposed between the first transfer wiring PBL1 and the second transfer wiring PBL2. Thus, even if the transfer wiring is heated by laser or the like, a short circuit due to melting of a metallic component may be prevented.

Furthermore, the barrier member BA may be formed in the process of forming the insulation layers of the display area DA. Thus, reliability of a display device may be increased without performing an additional process.

FIGS. 9, 10, 11 and 12 are cross-sectional views illustrating cross-sections of a peripheral area of a display device according to exemplary embodiments of the present invention.

Figure 9:
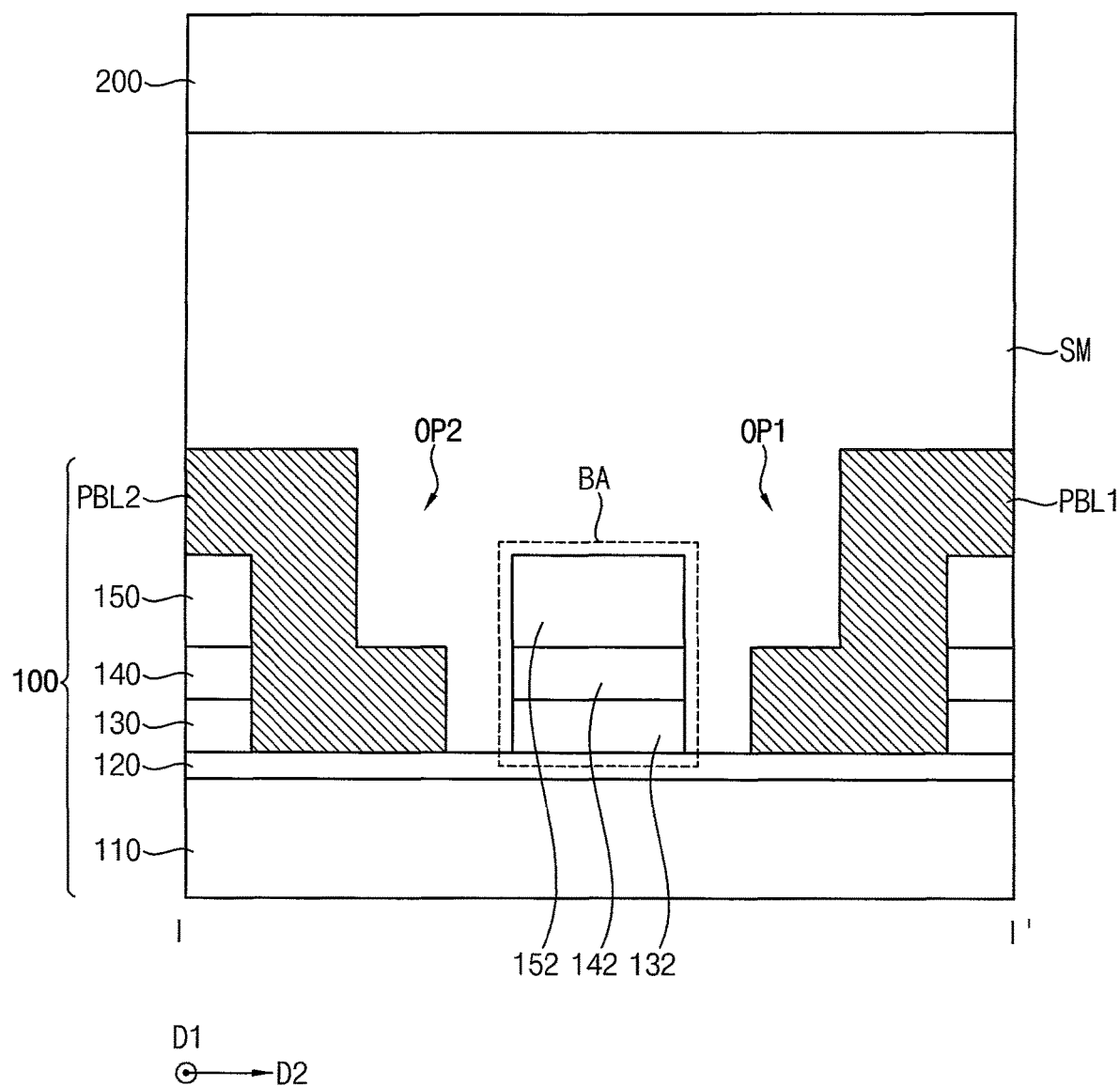
FIGS. 9, 10, 11 and 12 are cross-sectional views illustrating cross-sections of a peripheral area of a display device according to exemplary embodiments of the present invention.

Referring to FIG. 9, a sealing member SM is disposed between an array substrate 100 and an encapsulation substrate 200 in a peripheral area. In the peripheral area, insulation layers including a buffer layer may be disposed on a base substrate 110 of the array substrate 100. For example, a buffer layer 120, a first insulation layer 130, a second insulation layer 140 and a third insulation layer 150 are disposed on the base substrate 110. At least one of the buffer layer 120, the first insulation layer 130, the second insulation layer 140 and the third insulation layer 150 may be partially removed to form a first recess OP1 and a second recess OP2.

The first recess OP1 and the second recess OP2 may extend along a first direction (e.g., the D1 direction) and may be spaced apart from each other along a second direction (e.g., the D2 direction) crossing the first direction (e.g., the D1 direction). A portion of the insulation layers, which remains between the first and second recesses OP1 and OP2, may define a barrier member BA.

The array substrate 100 includes a first transfer wiring PBL1 and a second transfer wiring PBL2, which are disposed in the peripheral area. The first transfer wiring PBL1 and the second transfer wiring PBL2 may be spaced apart from each other along the second direction (e.g., the D2 direction). A first portion of the first transfer wiring PBL1 may be disposed in the first recess OP1, and a second portion may be disposed on the third insulation layer 150 adjacent to the first recess OP1. For example, the first portion of the first transfer wiring PBL1 may be disposed on an upper surface of the buffer layer 120 including a gap between an end thereof and a side surface of the barrier member BA. The second portion of the first transfer wiring PBL2 may extend along a side surface of the third insulation layer 150 and an upper surface of the third insulation layer 150. A first portion of the second transfer wiring PBL2 may be disposed in the second recess OP2, and a second portion may be disposed on the third insulation layer 150 adjacent to the second recess OP2.

The first transfer wiring PBL1 and the second transfer wiring PBL2 may be spaced apart from the barrier member BA. The sealing member SM may be disposed on the first transfer wiring PBL1 and the second transfer wiring PBL2.

In an exemplary embodiment of the present invention, the first transfer wiring PBL1 and the second transfer wiring PBL2 may be spaced apart from each other by a barrier member BA. Furthermore, the first transfer wiring PBL1 and the second transfer wiring PBL2 may be partially disposed in a recess.

Figure 10:
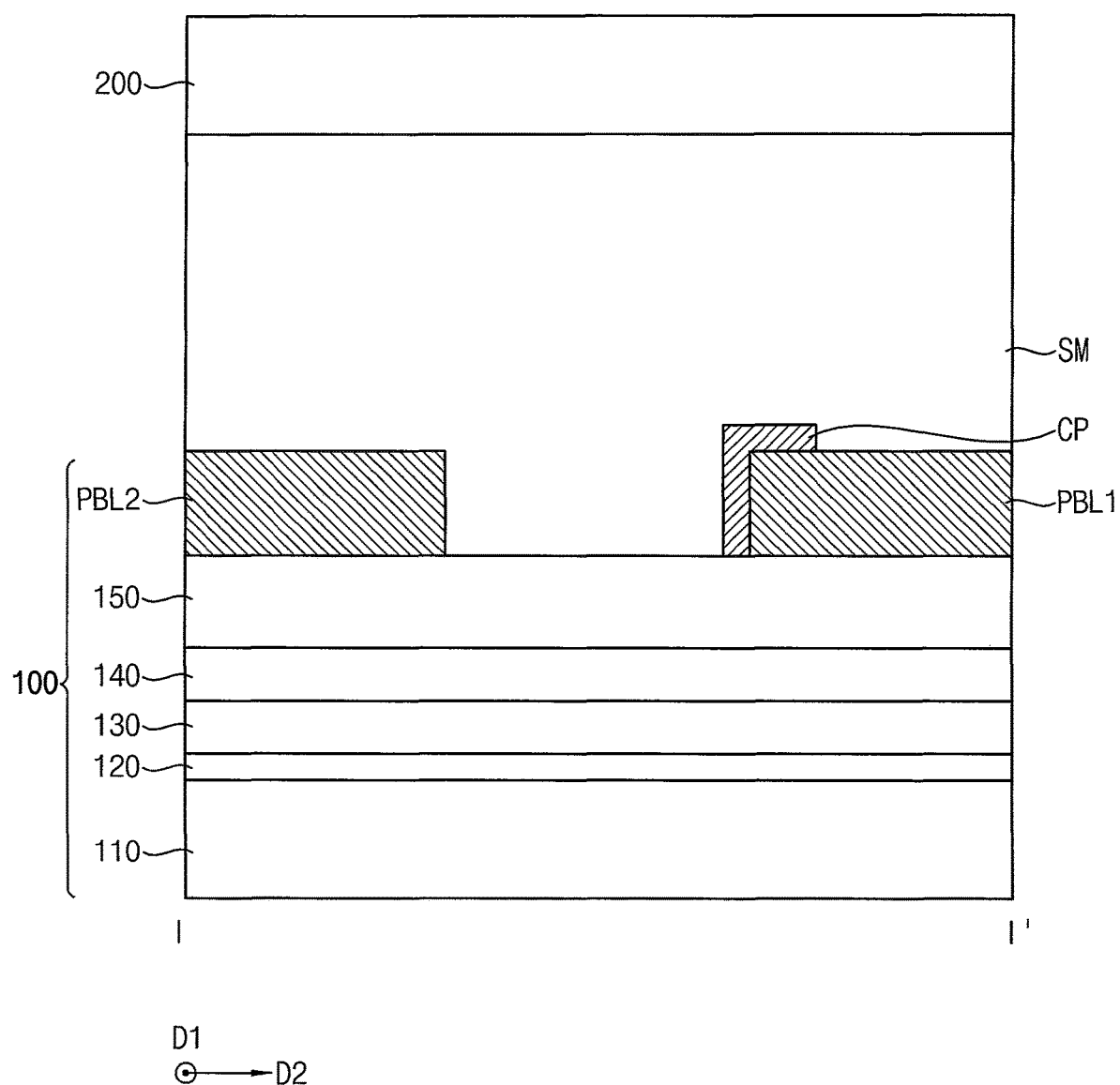

Referring to FIG. 10, a sealing member SM is disposed between an array substrate 100 and an encapsulation substrate 200 in a peripheral area. In the peripheral area, insulation layers including a buffer layer may be disposed on a base substrate 110 of the array substrate 100. For example, a buffer layer 120, a first insulation layer 130, a second insulation layer 140 and a third insulation layer 150 are disposed on the base substrate 110.

The array substrate 100 includes a first transfer wiring PBL1 and a second transfer wiring PBL2, which are disposed in the peripheral area. The first transfer wiring PBL1 and the second transfer wiring PBL2 may extend along a first direction (e.g., the D1 direction) and may be spaced apart from each other along a second direction (e.g., the D2 direction) crossing the first direction (e.g., the D1 direction).

An end of at least one of the first transfer wiring PBL1 and the second transfer wiring PBL2 may be capped by a capping pattern CP. For example, the capping pattern CP may cover an end of the first transfer wiring PBL1, which is adjacent to the second transfer wiring PBL2. In an exemplary embodiment of the present invention, the capping pattern CP may partially cover the first transfer wiring PBL1 in view of design margin and efficiency. However, exemplary embodiments are not limited thereto. In an exemplary embodiment of the present invention, the capping pattern CP may entirely cover the first transfer wiring PBL1 in the sealing area.

According to an exemplary embodiment of the present invention, the capping pattern CP may cover a lateral surface and a partial upper surface of an edge region of the first transfer wiring PBL1 facing the second transfer wiring PBL2.

In an exemplary embodiment of the present invention, the capping pattern CP includes a metal having a higher melting point than the transfer wirings. For example, at least one of the first and second transfer wirings PBL1 and PBL2 may include aluminum, and the capping pattern CP may include silver. The melting point (about 960° C.) of silver is higher than the melting point (about 660° C.) of aluminum. Thus, metal migration from the first and second transfer wirings PBL1 and PBL2 may be prevented by the capping pattern CP.

In an exemplary embodiment of the present invention, the capping pattern CP may be formed from a same layer as an anode of the display area. Thus, the capping pattern CP may have a stacked structure including a silver layer and a conductive oxide layer.

Figure 11:
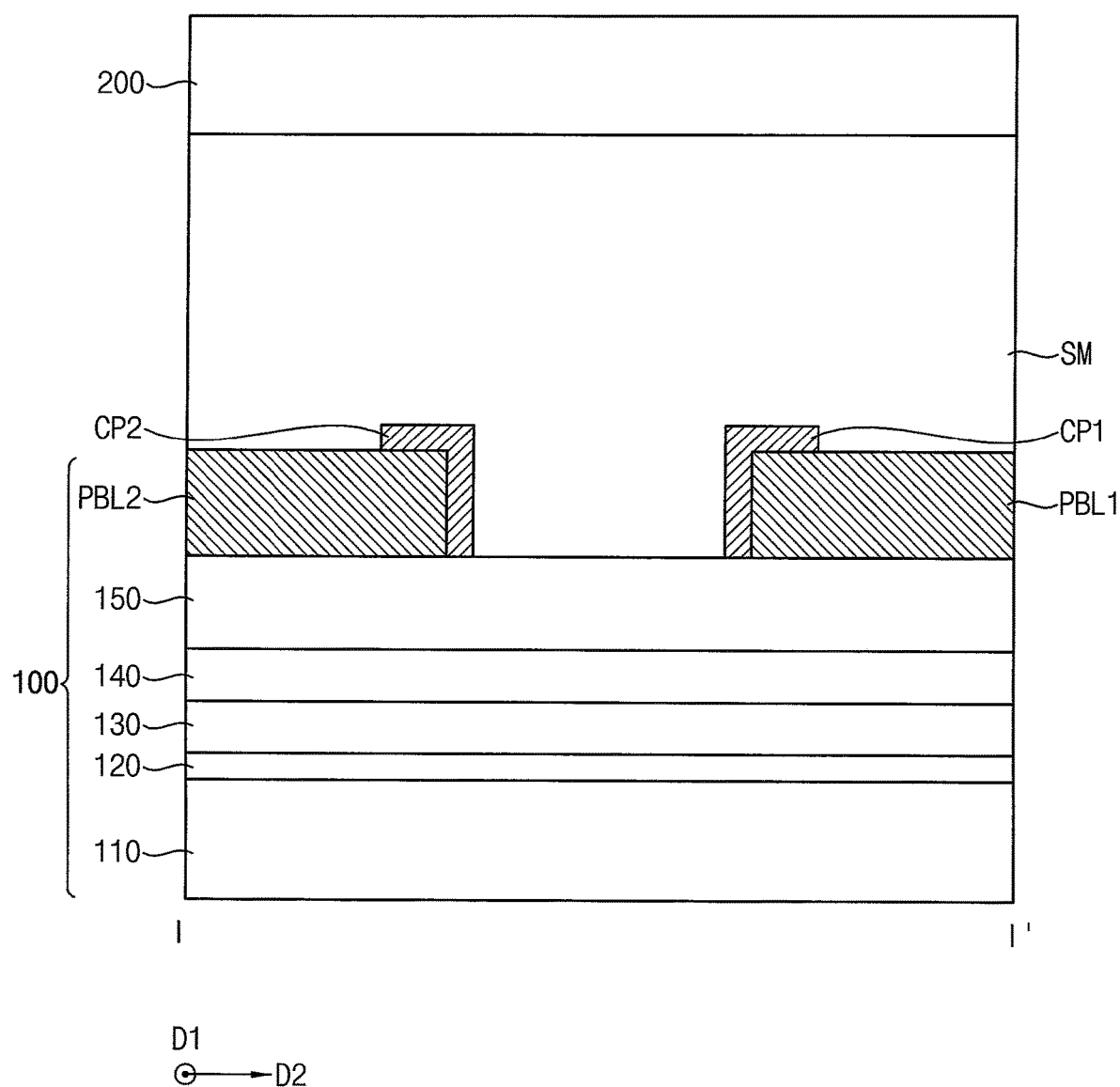

In an exemplary embodiment of the present invention, the capping pattern CP may cap one of the first transfer wiring PBL1 and the second transfer wiring PBL2. For example, when an area irradiated by a laser is adjacent to the first transfer wiring PBL1, the capping pattern CP may cap only the first transfer wiring PBL1. When a plurality of capping patterns CP cover both of the first transfer wiring PBL1 and the second transfer wiring PBL, a short circuit between the wirings may be caused, or a required distance between first transfer wiring PBL1 and the second transfer wiring PBL2 to be designed may be increased. However, exemplary embodiments of the present invention are not limited thereto. As illustrated in FIG. 11, an array substrate 100 may include a first capping pattern CP1 capping a first transfer wiring PBL1 and a second capping pattern CP2 capping a second transfer wiring PBL2.

Figure 12:
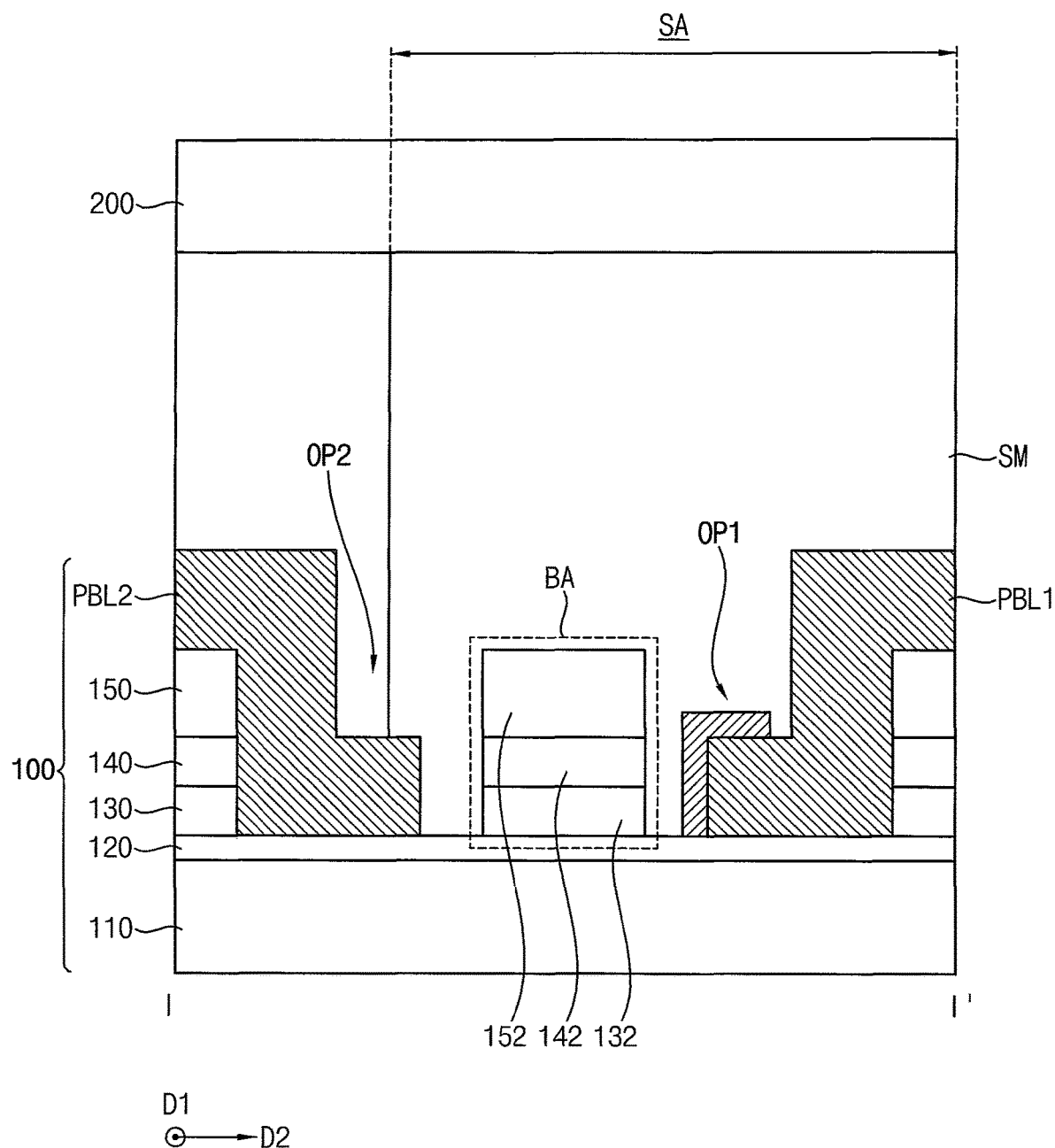

Referring to FIG. 12, a sealing member SM is disposed between an array substrate 100 and an encapsulation substrate 200 in a peripheral area. In the peripheral area, insulation layers including a buffer layer may be disposed on a base substrate 110 of the array substrate 100. For example, a buffer layer 120, a first insulation layer 130, a second insulation layer 140 and a third insulation layer 150 are disposed on the base substrate 110. At least one of the buffer layer 120, the first insulation layer 130, the second insulation layer 140 and the third insulation layer 150 may be partially removed to form a first recess OP1 and a second recess OP2.

The first recess OP1 and the second recess OP2 may extend along a first direction (e.g., the D1 direction) and may be spaced apart from each other along a second direction (e.g., the D2 direction) crossing the first direction (e.g., the D1 direction). A portion of the insulation layers, which remains between the first and second recesses OP1 and OP2, may define a barrier member BA.

The array substrate 100 includes a first transfer wiring PBL1 and a second transfer wiring PBL2, which are disposed in the peripheral area. The first transfer wiring PBL1 and the second transfer wiring PBL2 may be spaced apart from each other along the second direction (e.g., the D2 direction). At least a portion of the first transfer wiring PBL1 may be disposed in the first recess OP1, and at least a portion of the second transfer wiring PBL2 may be disposed in the second recess OP2.

The array substrate 100 includes a capping pattern CP covering an end of at least one of the first transfer wiring PBL1 and the second transfer wiring PBL2. The capping pattern CP may be disposed in the first recess OP1 or in the second recess OP2.

Figure 13:
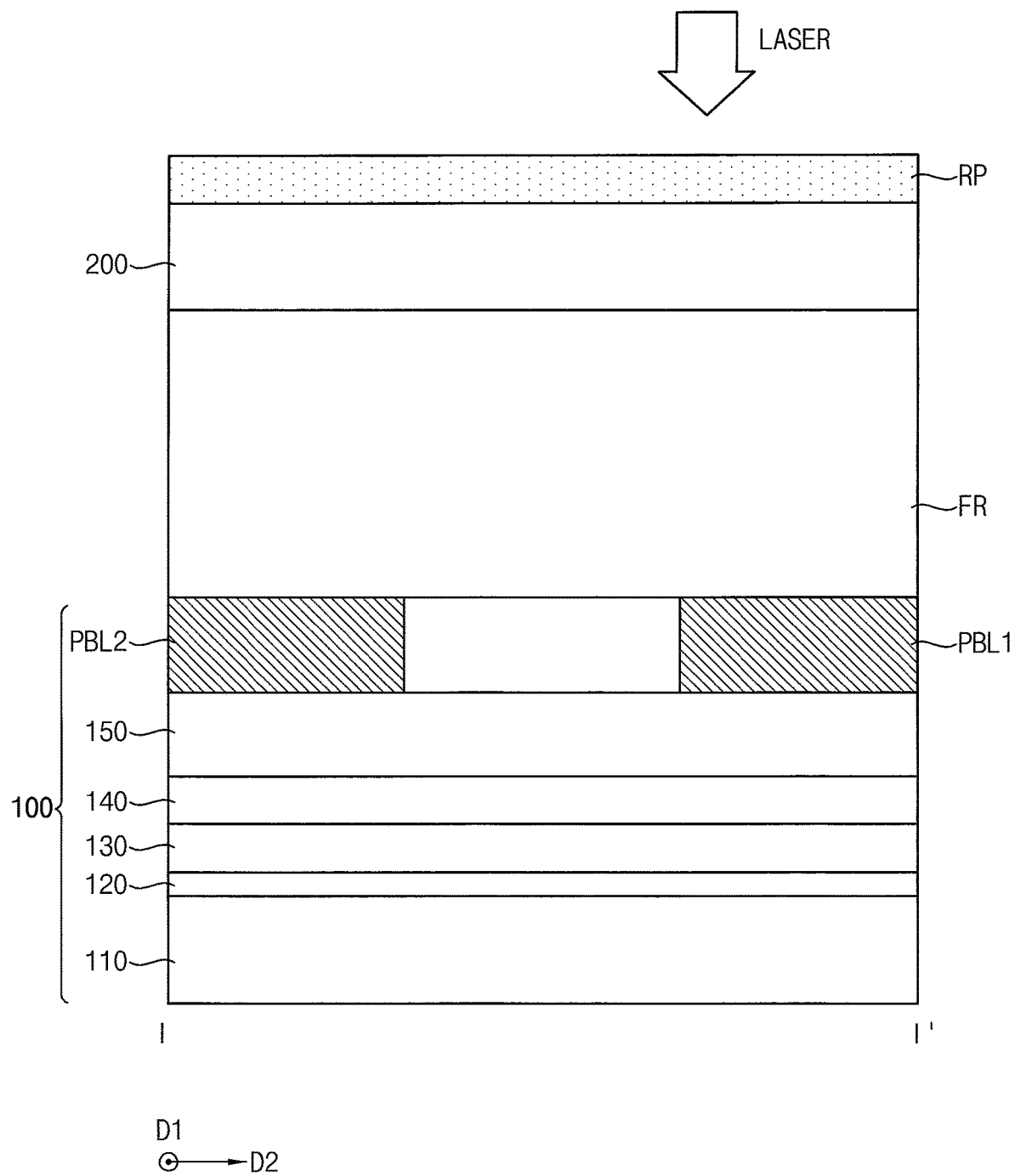
FIG. 13 is a cross-sectional view illustrating a method for manufacturing a display device according to an exemplary embodiment of the present invention.
Figure 14:
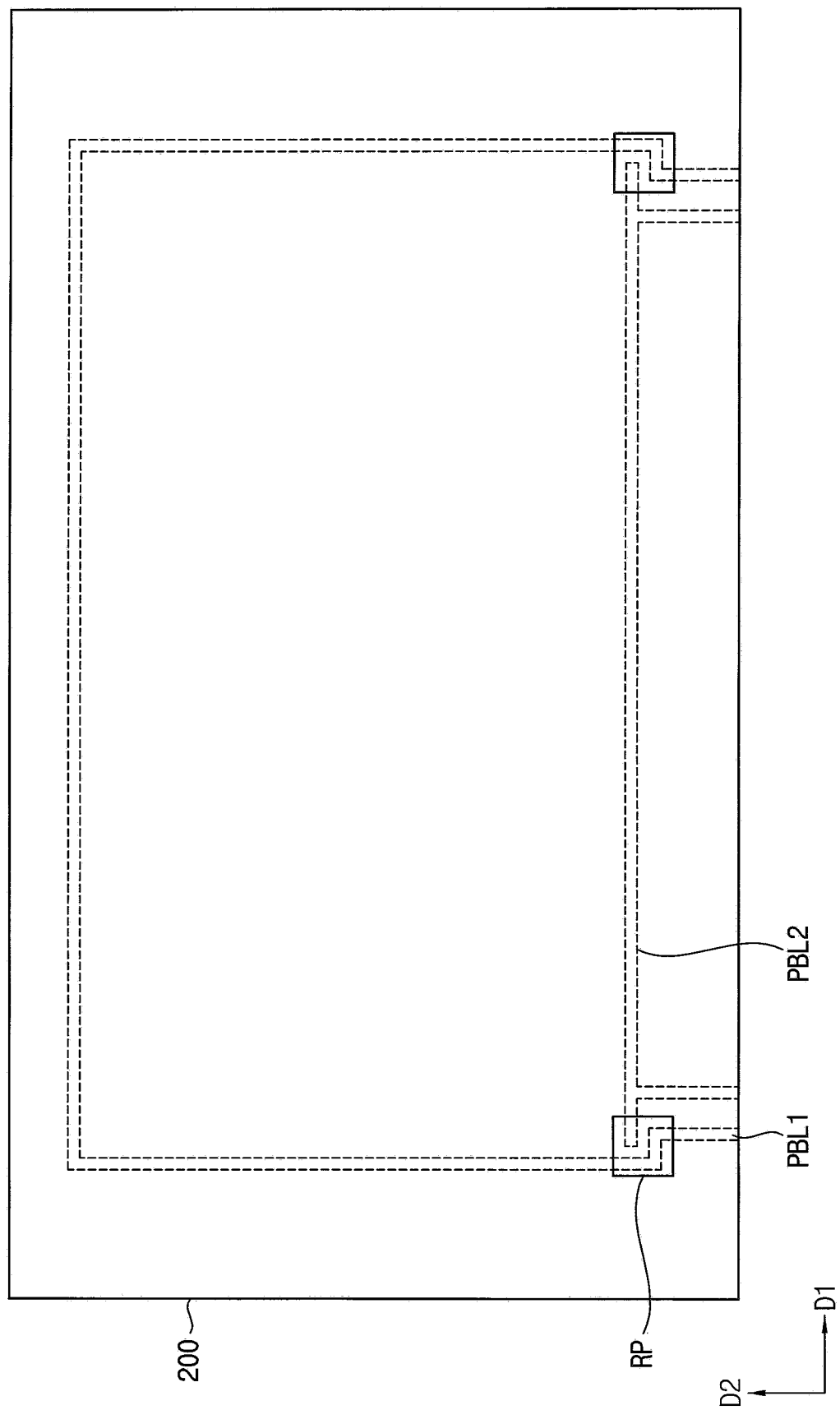
FIG. 14 is a plan view illustrating a display device according to an exemplary embodiment of the present invention.
Figure 15:
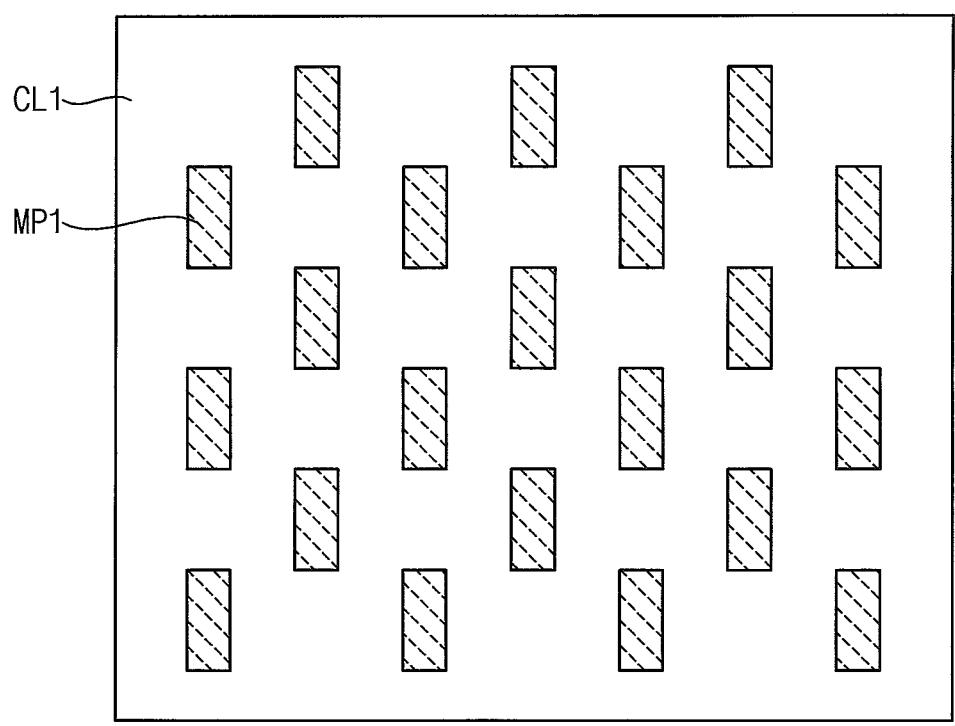
FIGS. 15 and 16 are enlarged plan views illustrating a transmittance-adjusting pattern of the display device illustrated in FIG. 14 of the present invention.
Figure 16:
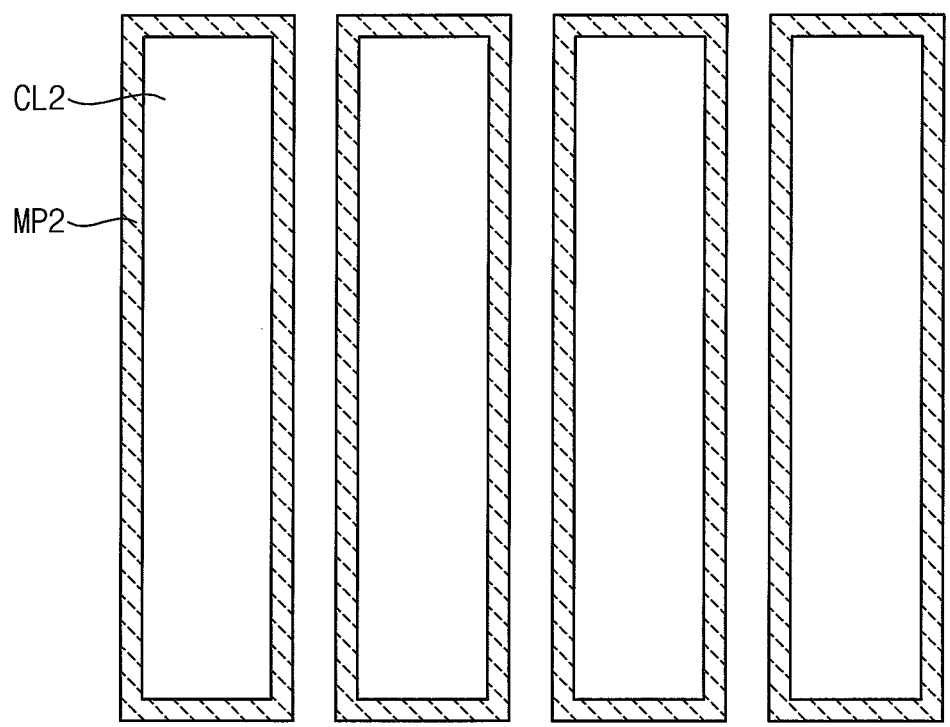

FIG. 13 is a cross-sectional view illustrating a method for manufacturing a display device according to an exemplary embodiment of the present invention. FIG. 14 is a plan view illustrating a display device according to an exemplary embodiment of the present invention. FIGS. 15 and 16 are enlarged plan views illustrating a transmittance-adjusting pattern of the display device illustrated in FIG. 14.

Referring to FIG. 13, a sealing material FR is disposed between an encapsulation substrate 200 and an array substrate 100 including a first transfer wiring PBL1 and a second transfer wiring PBL2. The sealing material FR is heated and sintered by irradiating laser through the encapsulation substrate 200 to form a sealing member combining the array substrate 100 with the encapsulation substrate 200.

The encapsulation substrate 200 includes a transmittance-adjusting pattern RP. For example, the transmittance-adjusting pattern RP may be disposed on an upper surface of the encapsulation substrate 200. However, exemplary embodiments of the present invention are not limited thereto. For example, the transmittance-adjusting pattern RP may be disposed on an lower surface of the encapsulation substrate 200 and may contact the sealing material FR or the sealing member.

An area where the transmittance-adjusting pattern RP is disposed has a laser transmittance lower than a laser transmittance of an area where the transmittance-adjusting pattern RP is not disposed. For example, the area where the transmittance-adjusting pattern RP is disposed may have a laser transmittance lower than a laser transmittance of the area where the transmittance-adjusting pattern RP is not disposed by at least 5%. Thus, melting of the first and second transfer wirings PBL1 and PBL2 may be prevented or reduced in the area where the transmittance-adjusting pattern RP is disposed.

The transmittance-adjusting pattern RP may be selectively disposed in a short-weak area in order to minimize efficiency decreased of a sealing process. For example, the transmittance-adjusting pattern RP may overlap an area, where the transfer wirings extend along a first direction (e.g., the D1 direction) and are spaced apart from each other along a second direction (e.g., the D2 direction) crossing the first direction (e.g., the D1 direction), as illustrated in FIG. 14. According to a design for reducing a bezel, a possibility of a short circuit by the sealing process may be relatively large in the area, since a distance between the first and second transfer wirings PBL1 and PBL2 is reduced in the area.

For example, the transmittance-adjusting pattern RP may include a metal, a metal alloy, a metal oxide, a metal nitride or a combination thereof.

In an exemplary embodiment of the present invention, the transmittance-adjusting pattern RP may include a metal oxide. For example, the metal oxide may include indium zinc oxide, indium tin oxide, indium oxide, zinc oxide, tin oxide or a combination thereof.

In an exemplary embodiment of the present invention, the transmittance-adjusting pattern RP may have a stacked structure including a metal oxide and a metal.

For example, the metal may include gold, silver, aluminum, copper, nickel, platinum, magnesium, chromium, tungsten, molybdenum, titanium, tantalum or an alloy thereof.

For example, the transmittance-adjusting pattern RP may include a metal oxide layer CL and metal patterns MP1 disposed on the metal oxide layer CL1 and spaced apart from each other at regular or irregular intervals. The metal oxide layer CL1 may be a continuous layer in the area, where the transmittance-adjusting pattern RP is disposed. For example, the metal patterns MP1 may be arranged in a matrix configuration, as illustrated in FIG. 15. For example, the metal patterns MP1 may be arranged in a staggered array.

The metal patterns MP1 may further decrease a laser transmittance. The metal patterns MP1 have a conductivity larger than a conductivity of the metal oxide. Thus, when a metal layer is formed continuously in the area, a problem due to static electricity may be caused. In an exemplary embodiment of the present invention, the metal patterns MP1 spaced apart from each other are combined with the metal oxide layer CL1 which may prevent the problem. For example, the metal patterns MP1 may include molybdenum, and the metal oxide layer CL1 may include indium tin oxide.

In an exemplary embodiment of the present invention, as illustrated in FIG. 16, a transmittance-adjusting pattern RP' may include metal oxide patterns CL2 and metal patterns MP2 having a shape at least partially surrounding the metal oxide patterns CL2, respectively, in a plan view.

In the above, exemplary embodiments of the present invention for preventing a short circuit between first and second transfer wirings PBL1 and PBL2. However, exemplary embodiments of the present invention are not limited thereto. For example, if other transfer wirings such as a fan-out wiring include a bridge exposed to a sealing member SM, exemplary embodiments of the present invention may be applied to prevent a short circuit of the other transfer wirings.

The above exemplary embodiments of the present invention provide an organic-light emitting display device. However, exemplary embodiments of the present invention are not limited thereto. For example, exemplary embodiments of the present invention may be applied in a sealing structure of various display devices such as a liquid crystal display device, a electroluminescent display device, a micro LED display device or the like.

Exemplary embodiments of the present invention may be applied to various display devices. For example, exemplary embodiments of the present invention may be applied to vehicle-display device, a ship-display device, an aircraft-display device, portable communication devices, display devices for display or for information transfer, a medical-display device, etc.

Although exemplary embodiments of the present invention have been illustrated and described above, it will be understood by those of ordinary skill in the art that various changes in form and details may be made therein without departing from the spirit and scope of the present invention as defined by the appended claims.

What is claimed is:

1. A display device, comprising:
   an array substrate including a pixel array disposed on a display area, a first transfer wiring disposed on a peripheral area adjacent to the display area and electrically connected to the pixel array, a second transfer wiring disposed on the peripheral area adjacent to the display area and electrically connected to the pixel array, and a barrier member disposed between the first transfer wiring and the second transfer wiring, the barrier member including an inorganic insulation material, wherein the first and second transfer wirings provide different power voltages from each other to the pixel array; and
   a sealing member disposed between the array substrate and an encapsulation substrate to combine the array substrate with the encapsulation substrate, the sealing member contacting at least a portion of the first transfer wiring and the second transfer wiring, the sealing member including a glassy material and surrounding the display area in a plan view,
   wherein the first transfer wiring and the second transfer wiring are spaced apart from the barrier member such that a first portion of the sealing member is disposed in a first recess between the first transfer wiring and a first side of the barrier member adjacent to the first transfer wiring and a second portion of the sealing member is disposed between the second transfer wiring and a second side of the barrier member adjacent to the second transfer wiring, and
   wherein a first portion of the first transfer wiring is disposed in the first recess, and wherein a second portion of the first transfer wiring extends along a side surface and an upper surface of an insulating layer adjacent to the first recess, and contacts the sealing member.

2. The display device of claim 1, wherein the barrier member has a multi-layered structure.

3. The display device of claim 1, wherein a height of the barrier member is larger than a height of at least one of the first transfer wiring and the second transfer wiring.

4. The display device of claim 1, wherein the array substrate includes the insulating layer disposed on the peripheral area, and the insulating layer is partially removed in the peripheral area to form the first recess and a second recess, and the barrier member is disposed between the first recess and the second recess.

5. The display device of claim 4, wherein the first portion of the first, transfer wiring is disposed in the first recess, and a portion of the second transfer wiring is disposed in the second recess.

6. The display device of claim 1, wherein a capping pattern covers at least a portion of the first transfer wiring.

7. The display device of claim 6, wherein the capping pattern includes a material having a melting point higher than a melting point of the first transfer wiring.

8. The display device of claim 6, wherein the capping pattern includes silver, and the first transfer wiring includes aluminum.

9. The display device of claim I, wherein the pixel array includes an organic light-emitting element.

* * * * *